United States Patent
Kim et al.

(10) Patent No.: US 12,077,841 B2
(45) Date of Patent: Sep. 3, 2024

(54) MASK ASSEMBLY AND METHOD OF MANUFACTURING THE SAME

(71) Applicant: Samsung Display Co., Ltd., Yongin-Si (KR)

(72) Inventors: Kwanghyun Kim, Hwaseong-si (KR); Heonsik Ha, Hwaseong-si (KR); Woo-Seok Jeon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 88 days.

(21) Appl. No.: 17/516,030

(22) Filed: Nov. 1, 2021

(65) Prior Publication Data

US 2022/0195578 A1 Jun. 23, 2022

(30) Foreign Application Priority Data

Dec. 23, 2020 (KR) .......................... 10-2020-0181956

(51) Int. Cl.
*C23C 14/04* (2006.01)
*B05D 1/32* (2006.01)
*B05D 5/06* (2006.01)
*C23C 14/08* (2006.01)

(52) U.S. Cl.
CPC .............. *C23C 14/042* (2013.01); *B05D 1/32* (2013.01); *B05D 5/06* (2013.01); *C23C 14/08* (2013.01); *Y10T 29/49826* (2015.01)

(58) Field of Classification Search
CPC ..... C23C 14/042; C23C 14/08; C23C 14/165; C23C 14/185; C23C 14/205; C23C 14/34; C23C 14/12; B05D 1/32; B05D 5/06; Y10T 29/49826; H10K 71/166; H10K 71/00

See application file for complete search history.

(56) References Cited

U.S. PATENT DOCUMENTS

| | | | |
|---|---|---|---|
| 6,566,156 B1 * | 5/2003 | Sturm | H10K 50/8423 438/82 |
| 6,573,167 B2 * | 6/2003 | Xing | H10B 53/00 257/E21.252 |
| 6,664,183 B2 | 12/2003 | Fukuzawa et al. | |
| 7,910,443 B2 * | 3/2011 | Cho | H01L 21/32139 438/585 |
| 8,999,838 B2 * | 4/2015 | Yang | H01L 21/76816 257/314 |

(Continued)

FOREIGN PATENT DOCUMENTS

| KR | 100341154 B1 | 6/2002 |
|---|---|---|
| KR | 1020170066766 A | 6/2017 |

(Continued)

*Primary Examiner* — Duy Vu N Deo
*Assistant Examiner* — Christopher Remavege
(74) *Attorney, Agent, or Firm* — CANTOR COLBURN LLP

(57) ABSTRACT

A manufacturing method of a mask assembly includes forming a cell mask including masking patterns and a mesh frame including conductive patterns disposed to correspond to the masking patters and disposing the cell mask and the mesh frame on a mask frame. The forming the cell mask and the mesh frame includes forming a polymer layer, a conductive layer, and a hard masking layer, forming a mask pattern layer including etch patterns, and forming the cell mask and the mesh frame using the mask pattern layer.

16 Claims, 14 Drawing Sheets

(56) References Cited

U.S. PATENT DOCUMENTS

| | | | |
|---|---|---|---|
| 9,379,324 B2* | 6/2016 | Takeda | H10K 71/60 |
| 9,972,810 B2 | 5/2018 | Moon et al. | |
| 10,195,838 B2* | 2/2019 | Saito | B32B 38/10 |
| 11,584,983 B2* | 2/2023 | Kim | H10K 71/166 |
| 2008/0206676 A1* | 8/2008 | De | G03F 7/094 |
| | | | 430/326 |
| 2017/0365822 A1* | 12/2017 | Kim | H10K 71/00 |
| 2018/0002803 A1* | 1/2018 | Niboshi | C23C 14/042 |
| 2018/0355466 A1* | 12/2018 | Mu | C23C 14/042 |
| 2019/0044070 A1* | 2/2019 | Nishida | B32B 7/025 |
| 2019/0233931 A1* | 8/2019 | Zhang | H10K 71/166 |
| 2021/0217997 A1 | 7/2021 | Kwag et al. | |
| 2021/0277512 A1 | 9/2021 | Kim et al. | |
| 2022/0131076 A1* | 4/2022 | Chen | C23C 14/24 |

FOREIGN PATENT DOCUMENTS

| | | |
|---|---|---|
| KR | 1020190014188 A | 2/2019 |
| KR | 1020210091382 A | 7/2021 |
| KR | 10202100913282 A | 7/2021 |
| KR | 1020210113526 A | 9/2021 |

* cited by examiner

MASK ASSEMBLY AND METHOD OF MANUFACTURING THE SAME

This application claims priority to Korean Patent Application No. 10-2020-0181956, filed on Dec. 23, 2020, and all the benefits accruing therefrom under 35 U.S.C. § 119, the content of which in its entirety is herein incorporated by reference.

BACKGROUND

1. Field

Embodiments of the invention relate to a mask assembly and a method of manufacturing the same. More particularly, embodiments of the invention relate to a mask assembly having improved process yield and masking effect and a method of manufacturing the mask assembly.

2. Description of the Related Art

A display panel includes a plurality of pixels. Each of the plurality of pixels includes a driving element, such as a transistor, and a display element, such as an organic light emitting diode. The display element includes an electrode and a light emission pattern.

The light emission pattern is formed by patterning a light emitting layer using a mask through which a masking pattern is defined. In recent years, technologies for a material and a manufacturing method for a large-area mask are being developed to increase a production yield of the display panel including the light emission pattern.

SUMMARY

Embodiments of the invention provide a mask assembly including a cell mask including a polymer material and a mesh frame including a conductive material.

Embodiments of the invention provide a method of manufacturing the mask assembly.

An embodiment of the invention provides a method of manufacturing a mask assembly. The manufacturing method includes forming a cell mask including a plurality of masking patterns and a mesh frame including a plurality of conductive patterns disposed to correspond to the plurality of masking patters, and disposing the cell mask and the mesh frame on a mask frame. The forming the cell mask and the mesh frame includes forming a polymer layer on a base substrate and forming a conductive layer on the polymer layer. The forming the cell mask and the mesh frame further includes forming a hard masking layer on the conductive layer and etching the hard masking layer and the conductive layer and forming a mask pattern layer including etch patterns. The forming the cell mask and the mesh frame further includes etching the polymer layer using the mask pattern layer and forming the cell mask and the mesh frame.

In an embodiment, the polymer layer may include a first polymer material, the hard masking layer may include a second polymer material, and the second polymer material may be different from the first polymer material.

In an embodiment, the forming the cell mask and the mesh frame may further include partially removing the mask pattern layer for the forming the mesh frame, and separating the base substrate from the cell mask.

In an embodiment, the mask pattern layer may include a first pattern layer formed by etching the hard masking layer and a second pattern layer formed by etching the conductive layer.

In an embodiment, the etching the polymer layer may be performed using a gas that selectively etches the polymer layer among the first pattern layer and the polymer layer.

In an embodiment, the partially removing the mask pattern layer may include removing the first pattern layer from the mask pattern layer using a gas that selectively etches the first pattern layer among the first and second pattern layers.

In an embodiment, the gas may selectively etch the first pattern layer among the cell mask, the first pattern layer, and the second pattern layer.

In an embodiment, the forming the cell mask and the mesh frame may further include coating a photoresist on the hard masking layer and patterning the photoresist and forming an etch mask.

In an embodiment, the etch patterns may include a plurality of first patterns provided on the first pattern layer and a plurality of second patterns provided on the second pattern layer.

In an embodiment, the forming the mask pattern layer may include etching the hard masking layer using the etch mask and forming the first pattern layer including the plurality of first patterns and etching the conductive layer using the first pattern layer and forming the second pattern layer including the plurality of second patterns.

In an embodiment, the forming the cell mask and the mesh frame further may include removing the etch mask after the forming the first pattern layer.

In an embodiment, the etching the hard masking layer may include etching the hard masking layer using a gas.

In an embodiment, the gas may selectively etch the hard masking layer among the hard masking layer and the conductive layer.

In an embodiment, the etching the conductive layer may be performed using an etchant that selectively etches the conductive layer among the first pattern layer, the conductive layer, and the polymer layer.

In an embodiment, the forming the cell mask and the mesh frame may further include etching the plurality of second patterns after the forming the cell mask and forming the conductive patterns.

In an embodiment, the etching the plurality of second patterns may include etching the plurality of second patterns included in the second pattern layer using an etchant that selectively etches the second pattern layer among the first pattern layer, the second pattern layer, and the cell mask.

An embodiment of the invention provides a mask assembly including a mask frame including an outer frame through which a cell opening is defined and a cell mask disposed on the mask frame and including a plurality of masking patterns disposed to correspond to the cell opening and a polymer material. The mask assembly further includes a mesh frame disposed between the mask frame and the cell mask and including a plurality of conductive patterns disposed to correspond to the plurality of masking patterns and a conductive material. A width of each of the plurality of masking patterns continuously decreases as a distance from a corresponding conductive pattern among the plurality of conductive patterns decreases.

In an embodiment, each of the plurality of conductive patterns may include a first surface that is in contact with the plurality of masking patterns and a second surface opposite to the first surface. The first surface may have a width equal to or smaller than the width of each of the plurality of masking patterns, and the second surface may have a width smaller than the width of the first surface.

In an embodiment, each of the plurality of conductive patterns may further include a side surface portion connecting the first surface and the second surface, and the side surface portion may have a curved surface shape.

In an embodiment, the mesh frame may include a metal material or a transparent conductive oxide, and the cell mask may include polyimide.

According to the above, since the mesh frame is disposed on the cell mask, the mask assembly is prevented from sagging due to gravity during the deposition process. In particular, the hard masking layer and the photoresist, which are used to form the cell mask, are used to form the mesh frame. Thus, the manufacturing process of the mask assembly is simplified, and the time for the manufacturing process is reduced.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION

Figure 1:
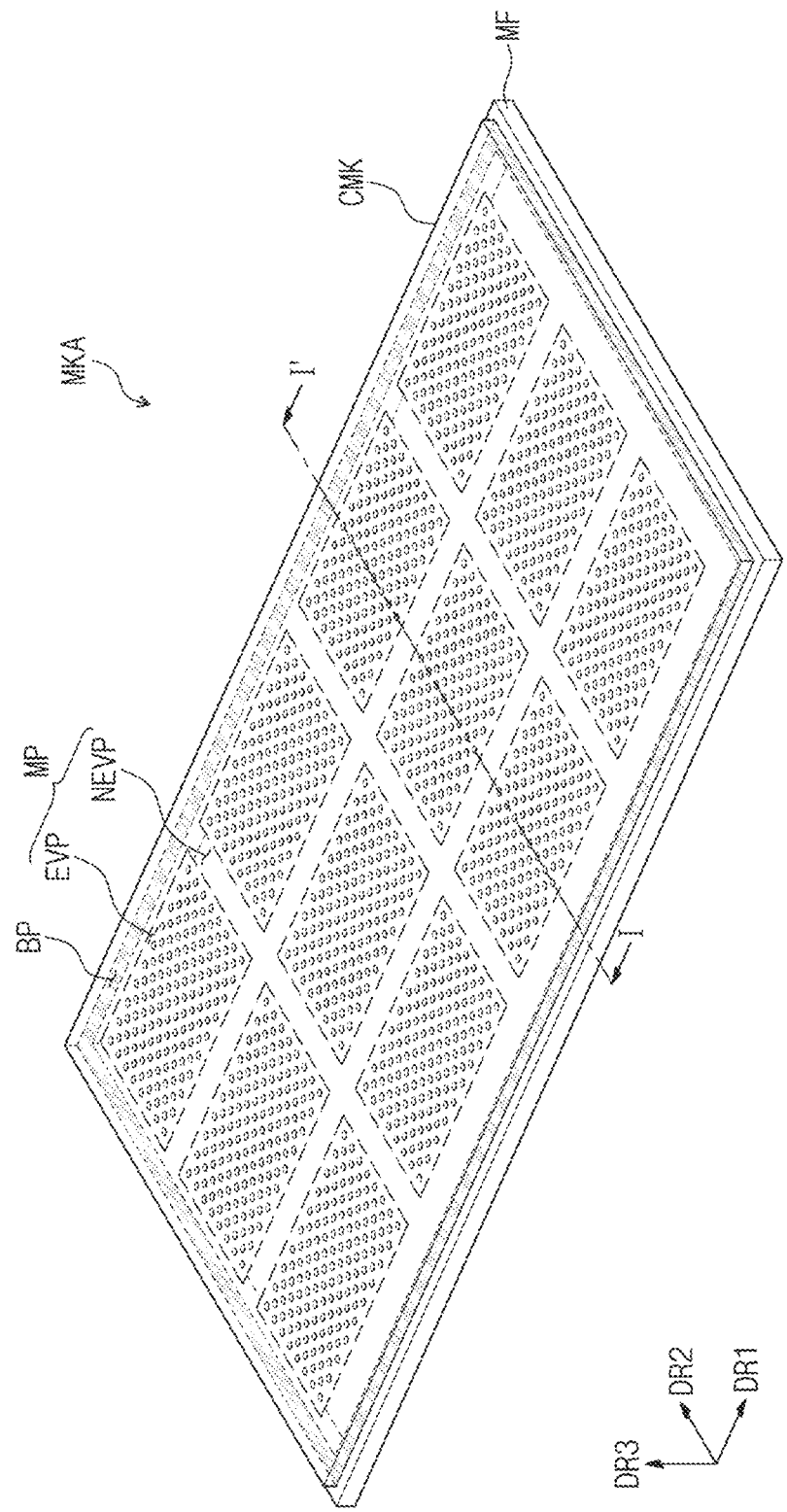
FIG. 1 is a perspective view showing an embodiment of a mask assembly according to the invention.

In the disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc., may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the drawing figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, a mask and a mask assembly will be explained in detail with reference to the accompanying drawings.

Figure 2:
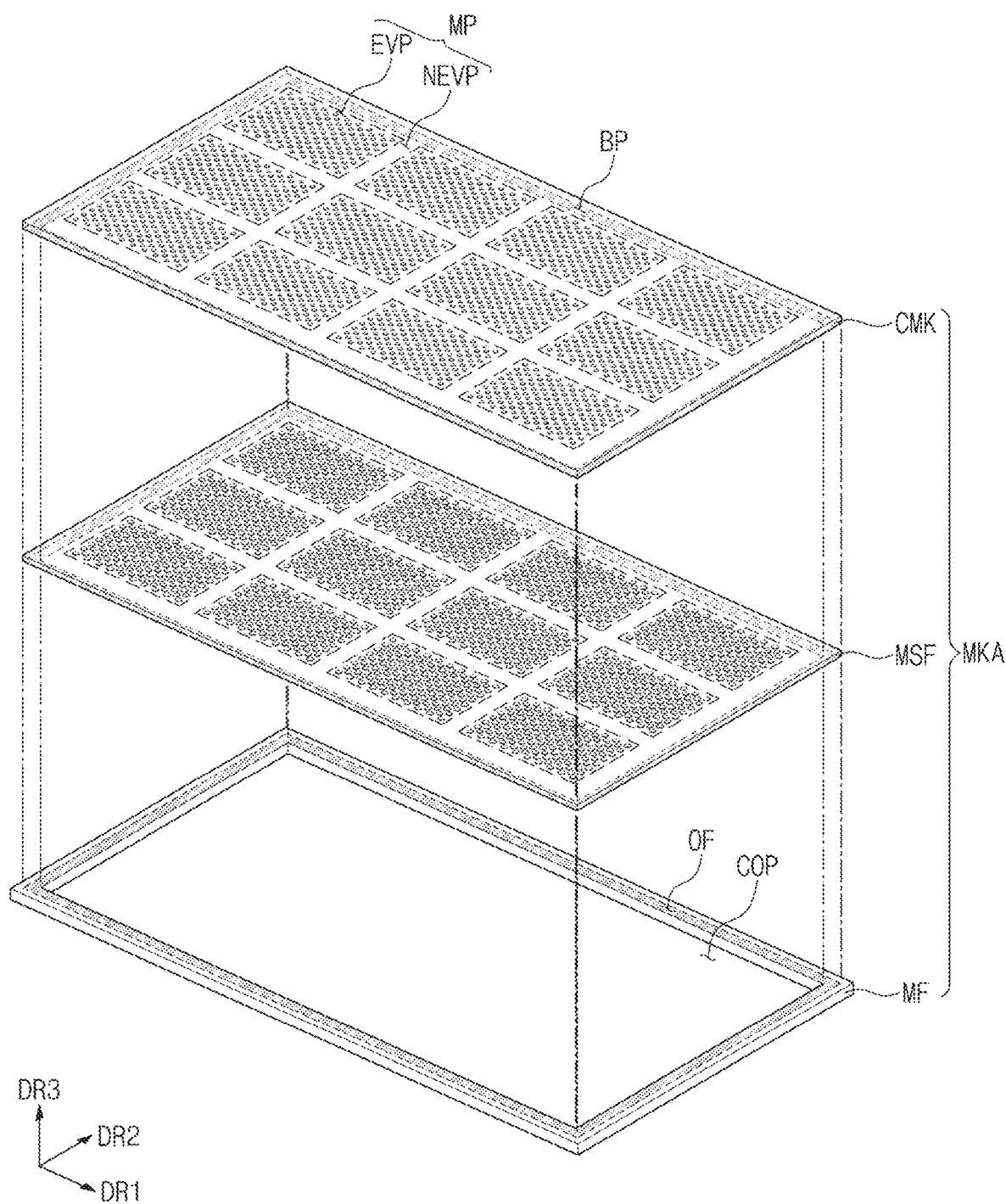
FIG. 2 is an exploded perspective view showing an embodiment of a mask assembly according to the invention.

FIG. 1 is a perspective view showing an embodiment of a mask assembly MKA according to the invention, and FIG. 2 is an exploded perspective view showing an embodiment of the mask assembly MKA according to the invention.

Referring to FIGS. 1 and 2, the mask assembly MKA may be used for a manufacturing process of a display device. In detail, the mask assembly MKA may be used for a process of forming a pattern on a substrate in the process of manufacturing the display device. In an embodiment, the pattern may be a light emitting pattern included in the light emitting element. The light emitting element may be an organic light emitting diode, and the light emitting pattern may be an organic light emitting pattern of the organic light emitting diode.

The mask assembly MKA may have a cuboid shape. In an embodiment, the mask assembly MKA may include two long sides extending in a first direction DR1 and two short sides extending in a second direction DR2. The second direction DR2 indicates a direction crossing the first direction DR1. In an embodiment, the second direction DR2 may be substantially perpendicular to the first direction DR1.

The mask assembly MKA may be a plate with a thin thickness in a third direction DR3. The third direction DR3 may indicate a direction substantially vertically crossing a plane defined by the first direction DR1 and the second direction DR2. Hereinafter, in the following descriptions, the expression "in a plan view" may mean a state of being viewed in the third direction DR3.

The mask assembly MKA may include a mask frame MF, a cell mask CMK, and a mesh frame MSF. The mask frame MF may include a metal material, such as a stainless steel ("SUS"), an Invar alloy, nickel (Ni), or cobalt (Co). In an embodiment, the mask frame MF may include the Invar alloy, for example. However, the material for the mask frame MF should not be limited thereto or thereby. In an embodiment, the mask frame MF may include a polyimide-based material to reduce weight of the mask assembly MKA.

The cell mask CMK may include a polymer material. In an embodiment, the cell mask CMK may include polyimide. In an embodiment, when the cell mask CMK includes polyimide, a weight of the mask assembly MKA is lighter compared with a case where the cell mask CMK includes a metal material. Accordingly, the mask assembly MKA may be prevented from sagging down by the weight thereof and gravity in a process of depositing a pattern on the display device.

The mask frame MF may have a quadrangular (e.g., rectangular) shape defined by long sides extending in the first direction DR1 and short sides extending in the second direction DR2. The mask frame MF may include an outer frame OF and may be provided with a cell opening COP defined through the outer frame OF. In a plan view, the cell opening COP may have a quadrangular (e.g., rectangular) shape. The cell opening COP may be defined through the mask frame MF in the third direction DR3. The shape of the cell mask CMK may be changed to correspond to the shape of the cell opening COP. That is, in the case where the cell opening COP has the quadrangular (e.g., rectangular) shape, the cell mask CMK may have the quadrangular (e.g., rectangular) shape. The cell mask CMK may overlap the cell opening COP in a plan view.

The cell mask CMK may include a masking portion MP and a bonding portion BP. The masking portion MP may include a plurality of deposition portions EVP and a non-deposition portion NEVP adjacent to the deposition portions EVP. Each of the deposition portions EVP may be provided with masking patterns MPT (refer to FIG. 3). The masking patterns MPT may be formed or provided by partially removing the cell mask CMK along the third direction DR3. The process of forming the masking patterns MPT will be described in detail with reference to FIGS. 5 to 14.

The bonding portion BP may extend from the masking portion MP. The bonding portion BP may extend from the masking portion MP in the first direction DR1 or the second direction DR2. In a plan view, the bonding portion BP may have a quadrangular ring shape and may be disposed along an edge of the masking portion MP.

In a plan view, a size of the masking portion MP of the cell mask CMK may be substantially the same as a size of the cell opening COP. The bonding portion BP of the cell mask CMK may be disposed on the outer frame OF of the mask frame MF.

The cell mask CMK may be fixed to the mask frame MF. In an embodiment, the bonding portion BP of the cell mask CMK may be fixed to a corresponding portion of the outer frame OF, for example. In an embodiment, a welding process may be performed between the outer frame OF and the corresponding bonding portion BP to fix the cell mask CMK to the mask frame MF, for example. In this case, the cell mask CMK may include a polymer material. In the case where the bonding portion BP of the cell mask CMK including the polymer material is directly welded to the outer frame OF, the cell mask CMK may be damaged. Accordingly, a protective layer may be disposed on the bonding portion BP of the cell mask CMK to prevent the cell mask CMK from being damaged during the welding process.

FIG. 2 shows one cell opening COP, however, this is merely one example, and the number of cell openings COP may be greater than one. In an embodiment, the mask frame MF may be provided with a plurality of cell openings arranged in at least one of the first direction DR1 and the second direction DR2 and spaced apart from each other. The cell openings may be arranged in a matrix form along the first direction DR1 and the second direction DR2. The mask assembly MKA may include the cell masks respectively corresponding to the cell openings. Each of the cell masks may include a deposition portion in which the masking patterns are provided and a non-deposition portion extending from the deposition portion.

The mesh frame MSF may be disposed between the mask frame MF and the cell mask CMK. The mesh frame MSF may have a shape corresponding to that of the cell mask CMK. The mesh frame MSF may include a plurality of conductive patterns CPT (refer to FIG. 3) disposed corresponding to the masking patterns MPT of the cell mask CMK. The mesh frame MSF may include a metal material or a transparent conductive oxide. In an embodiment, the mesh frame MSF may include SUS, Invar alloy, indium tin oxide ("ITO"), and indium zinc oxide ("IZO"). In an embodiment, the mesh frame MSF may have a shape corresponding to entire deposition portions EVP of the cell mask CMK. In addition, the mesh frame MSF may include a plurality of sub-mesh frames respectively corresponding to the deposition portions EVP of the cell mask CMK.

Figure 3:
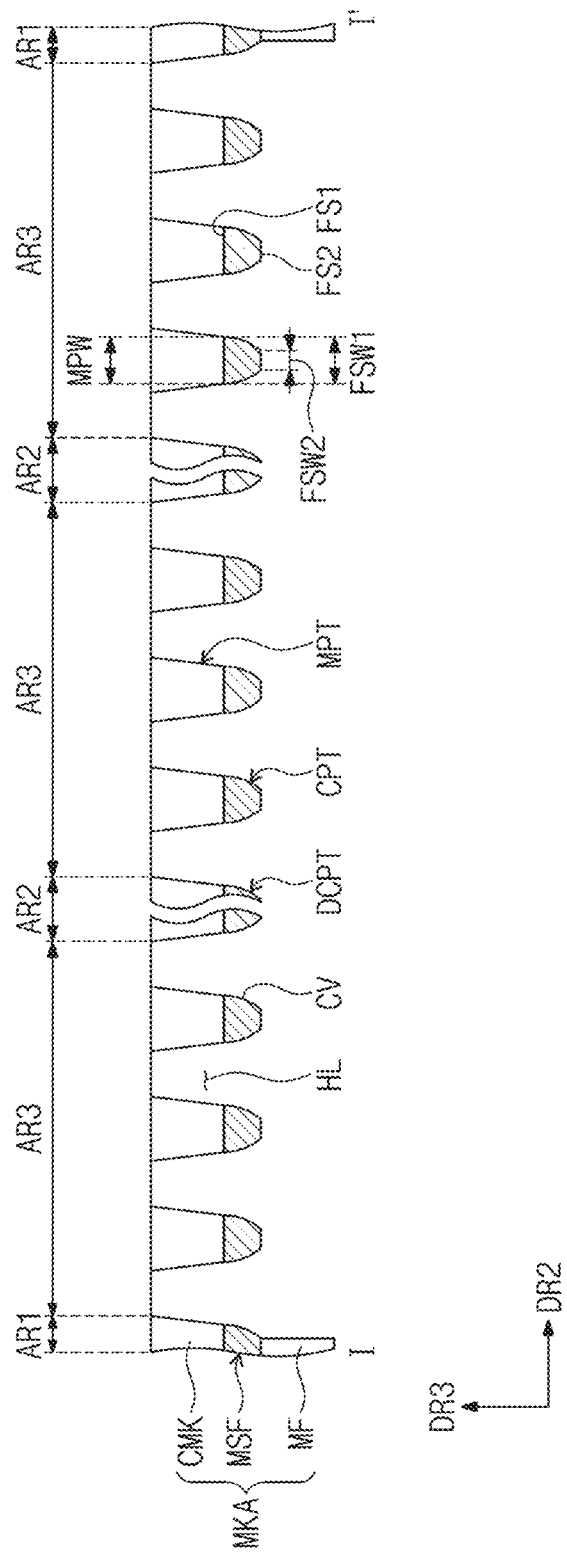
FIG. 3 is a cross-sectional view taken along line I-I' of FIG. 1 to show the mask assembly.

FIG. 3 is a cross-sectional view taken along line I-I' of FIG. 1 to show the mask assembly MKA.

Referring to FIG. 3, the mask assembly MKA may include the mask frame MF, the mesh frame MSF disposed on the mask frame MF, and the cell mask CMK disposed on the mesh frame MSF.

The cell mask CMK may include the masking patterns MPT, and a plurality of holes HL may be defined between the masking patterns MPT. The mesh frame MSF may include the conductive patterns CPT disposed to correspond to the masking patterns MPT.

The mask assembly MKA may include a first area AR1, a second area AR2, and a third area AR3.

The first area AR1 may be defined as an area in which the cell mask CMK and the mesh frame MSF are disposed on the outer frame OF (refer to FIG. 2) of the mask frame MF. The second area AR2 may be defined as an area corresponding to an area in which the non-deposition portion NEVP (refer to FIG. 2) in the masking portion MP is disposed. A third area AR3 may be defined as an area corresponding to an area in which the deposition portions EVP (refer to FIG. 2) included in the masking portion MP are disposed. The masking patterns MPT and the conductive patterns CPT may be formed or provided in the third area AR3. The mesh frame MSF may include a dummy conductive pattern DCPT that is disposed in the first and second areas AR1 and AR2 and corresponds to the cell mask CMK.

Each of the conductive patterns CPT may have a width that is equal to or smaller than a width MPW of a surface of corresponding masking patterns MPT, which is in contact with the conductive patterns CPT, among the masking patterns MPT. In an embodiment, each conductive pattern CPT may include a first surface FS1 that is in contact with the corresponding masking pattern MPT and a second surface FS2 opposite to the first surface FS1. The second surface FS2 may have a width FSW2 equal to or smaller than a width FSW1 of the first surface FS1. Accordingly, the conductive patterns CPT may not overlap the holes HL defined through the cell mask CMK. In an embodiment, each of the conductive patterns CPT may further include a side surface portion CV connecting the first surface FS1 and the second surface FS2. The side surface portion CV may have a curved surface shape.

Figure 11:
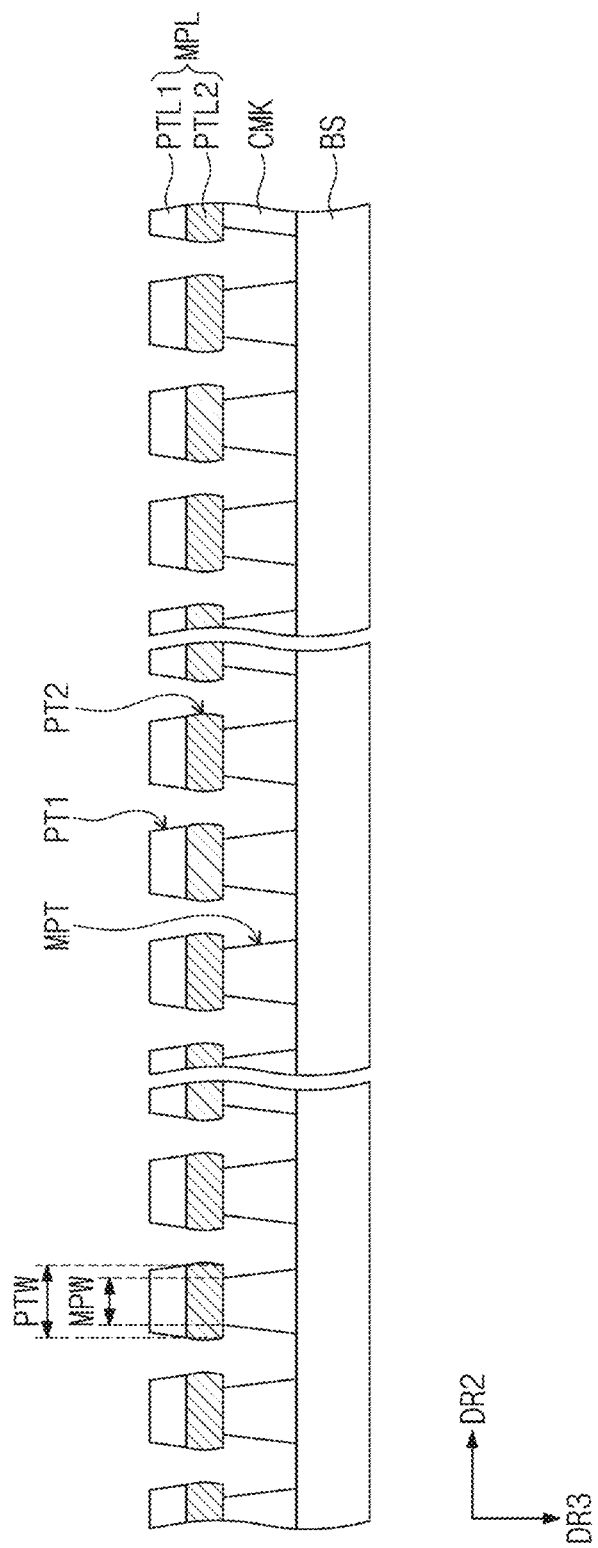
FIG. 11 is a view showing an embodiment of a process of forming a cell mask using a mask pattern layer according to the invention.

In an embodiment, the width MPW of the masking patterns MPT may be continuously changed along the third direction DR3. Referring to FIG. 11 described later, the masking patterns MPT may be formed or provided by a process of dry etching a polymer layer PL. The width MPW of each of the masking patterns MPT may continuously decrease as a distance from a corresponding conductive pattern CPT among the conductive patterns CPT along the third direction DR3 decreases.

Figure 4:
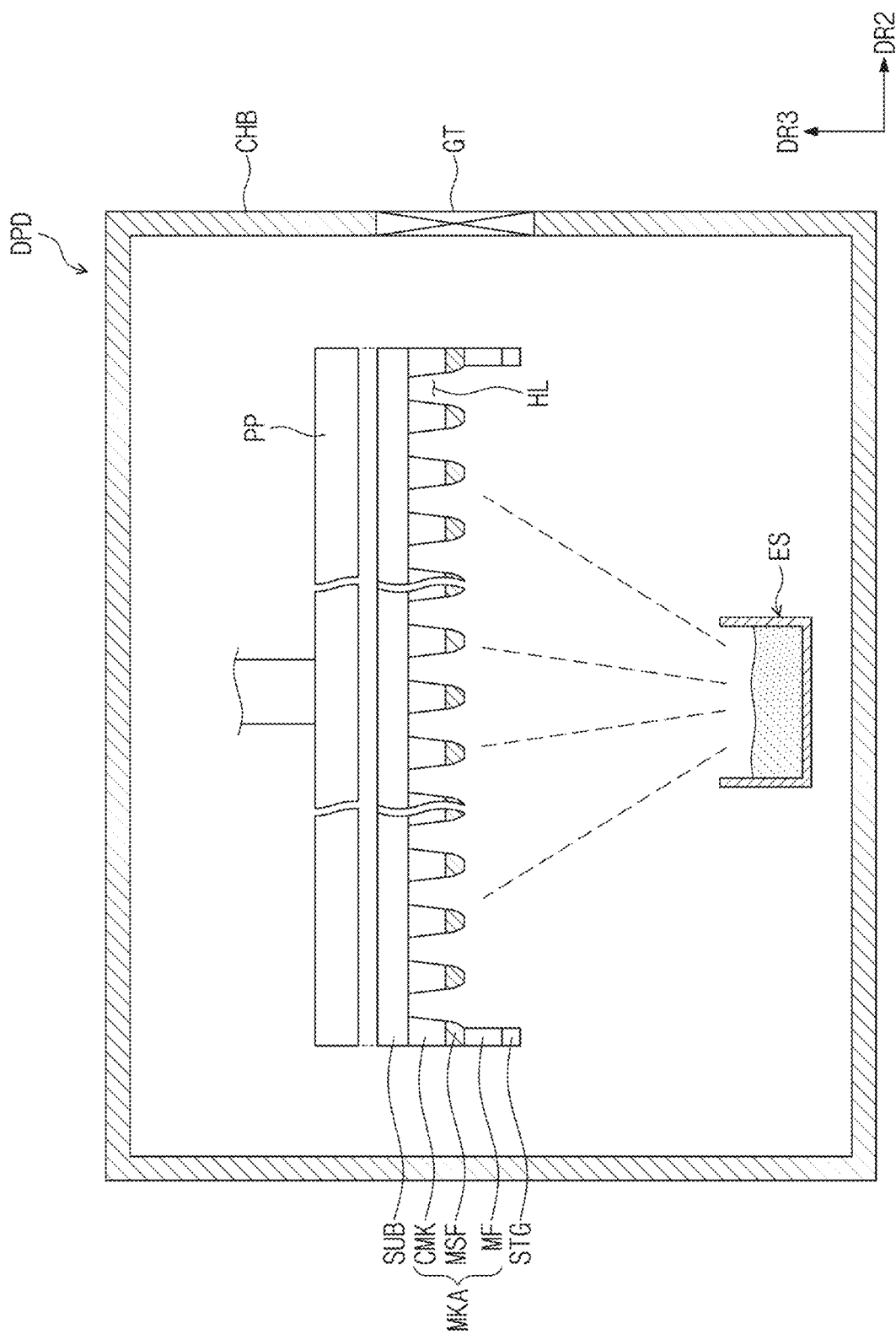
FIG. 4 is a cross-sectional view showing an embodiment of a deposition apparatus according to the invention.

FIG. 4 is a cross-sectional view showing an embodiment of a deposition apparatus DPD according to the invention.

Referring to FIGS. 3 and 4, the deposition apparatus DPD may include a chamber CHB, a deposition source ES, a stage STG, a moving plate PP, and a mask assembly MKA.

The chamber CHB may provide a confined space. The moving plate PP, the deposition source ES, the stage STG, and the mask assembly MKA may be disposed in the chamber CHB. The chamber CHB may include at least one gate GT. The chamber CHB may be opened and closed by the gate GT. A target substrate SUB may be loaded into or unloaded from the chamber CHB through the gate GT formed or provided through the chamber CHB.

The moving plate PP may align the target substrate SUB on the mask assembly MKA. The moving plate PP may move up and down or left and right. The moving plate PP may be provided with a member to move the target substrate SUB and a member to hold the target substrate SUB.

The deposition source ES may include a deposition material. In this case, the deposition material is a material that is sublimable or evaporable and may include at least one of an inorganic material, a metal material, and an organic material. The deposition source ES in the illustrated embodiment will be described as including an organic material used to manufacture an organic light emitting element.

The stage STG may be disposed above the deposition source ES. The mask assembly MKA may be disposed on the stage STG. The mask assembly MKA may be disposed on the stage STG after being manufactured through the mask assembly manufacturing process, which will be described later. The mask assembly MKA may face the deposition source ES. The stage STG may be disposed to overlap the mask frame MF of the mask assembly MKA and may support the mask assembly MKA. The stage STG may not overlap the masking portion MP (refer to FIG. 2) of the cell mask CMK. The stage may not overlap the deposition portions EVP (refer to FIG. 2) of the cell mask CMK. That is, the stage STG may not overlap a path through which the deposition material is supplied to the target substrate SUB from the deposition source ES.

The target substrate SUB may be disposed on the mask assembly MKA. The deposition material may be deposited on the target substrate SUB through the holes HL defined through the cell mask CMK to form a plurality of patterns on the target substrate SUB. In an embodiment, the patterns may be the light emitting pattern of the organic light emitting element.

In the process of depositing the light emitting pattern of the display device using the deposition apparatus DPD, a bottom-up deposition method in which the target substrate SUB is placed on a top position and the deposition material is deposited from a bottom position to the top position is mainly used. In this case, it is necessary to prevent a gap from occurring between the mask assembly MKA and the target substrate SUB when a portion of the mask assembly MKA, which does not overlap the stage STG and is not supported by the stage STG, is sagged down due to gravity. In a case where the mask assembly MKA includes a material that is magnetizable, such as a metal material, it may prevent the gap from occurring between the mask assembly MKA and the target substrate SUB by placing a magnet inside the moving plate PP or on an upper portion of the moving plate PP to form a magnetic field.

However, in the case where the cell mask CMK includes the polymer material in an embodiment of the invention, the cell mask CMK does not react to the magnetic field, and thus, it is difficult to prevent the gap from being defined between the cell mask CMK and the target substrate SUB. In an embodiment, the mesh frame MSF including the conductive material may be disposed between the mask frame MF and the cell mask CMK.

When the mesh frame MSF reacts to the magnetic field and is magnetized, the mesh frame MSF and the target substrate SUB may be closely in contact with each other without the gap between the cell mask CMK and the target substrate SUB. In an embodiment, when the mesh frame MSF includes the conductive patterns CPT disposed to correspond to the masking patterns MPT included in the cell mask CMK, a gap is not provided between the deposition portions EVP of the cell mask CMK and the target substrate SUB. Accordingly, a misalignment of the light emitting pattern, which is caused by the gap occurring between the cell mask CMK and the target substrate SUB, and a shadowing effect, which is caused by interfering the movement of the deposition material to the target substrate SUB, may decrease.

In addition, as an example, in the case where the width of each conductive pattern CPT is equal to or smaller than the width MPW of the corresponding masking pattern MPT, the mesh frame MSF may not be disposed on the path of the deposition material supplied to the target substrate SUB from the deposition source ES via the holes HL. Therefore, although the mesh frame MSF is disposed to prevent the gap from being defined between the cell mask CMK and the target substrate SUB, a phenomenon in which the deposition material is not deposited on the target substrate SUB due to the shadowing effect of the mesh frame may be prevented.

After the deposition material is deposited on the target substrate SUB by the deposition apparatus DPD, the target substrate SUB may be separated from the mask assembly MKA. An initial substrate separated from the mask assembly MKA may correspond to a state in which light emitting pattern layers are formed on the target substrate SUB. The light emitting pattern layers may be formed to correspond to the deposition portions EVP of the mask assembly MKA, respectively. Each of the light emitting pattern layers may include a plurality of light emitting patterns. Then, the display device including the organic light emitting element may be manufactured using the initial substrate.

Hereinafter, the method of manufacturing the mask assembly MKA will be described with reference to FIGS. 5 to 14.

Figure 5:
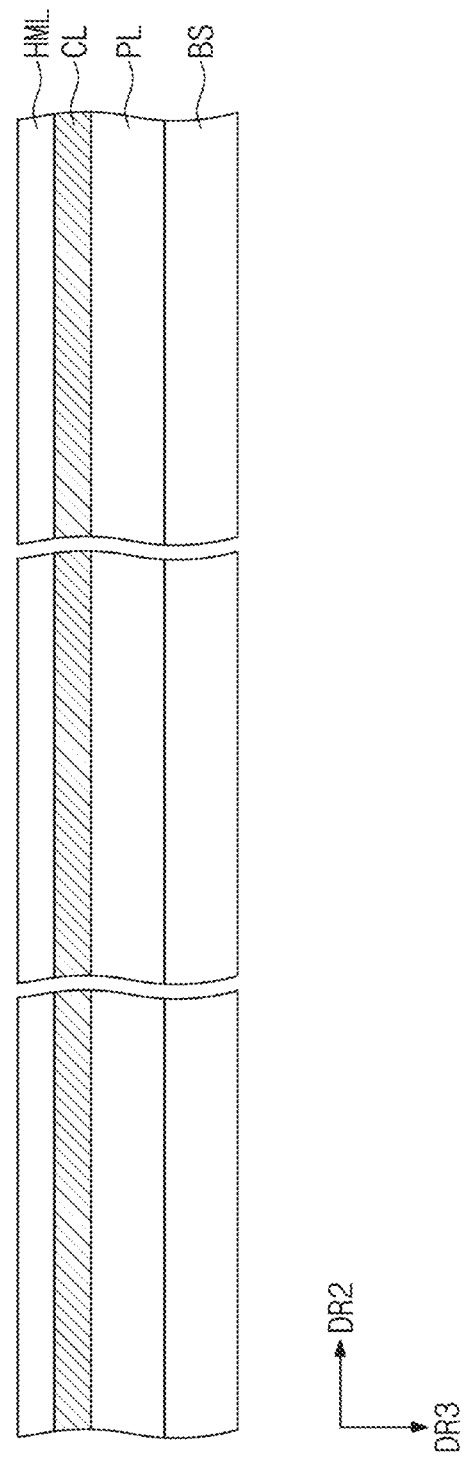
FIG. 5 is a view showing an embodiment of a process of forming a polymer layer, a conductive layer, and a hard masking layer on a base substrate according to the invention.

FIG. 5 is a view showing an embodiment of a process of forming the polymer layer, a conductive layer, and a hard masking layer on a base substrate according to the invention.

Referring to FIG. 3, the manufacturing method of the mask assembly MKA may include forming the cell mask CMK including the masking patterns MPT and forming the mesh frame MSF (refer to FIG. 4) including the conductive patterns CPT disposed to correspond to the masking patterns MPT. The manufacturing method of the mask assembly MKA may further include disposing the cell mask CMK and the mesh frame MSF on the mask frame MF.

Referring to FIG. 5, the forming the cell mask CMK and the mesh frame MSF may include forming the polymer layer PL on the base substrate BS, forming the conductive layer CL on the polymer layer PL, and forming the hard masking layer HML on the conductive layer CL.

In an embodiment, the base substrate BS may include a glass, plastic, ceramic, or metal material. The polymer layer PL may include a first polymer material. The polymer layer PL may be formed by coating the first polymer material on the base substrate BS. In an embodiment, the first polymer material may include polyimide.

The conductive layer CL may be formed by depositing a conductive material on the polymer layer PL. In an embodiment, the conductive layer CL may be formed by depositing the conductive material on the polymer layer PL using a sputtering process. In an embodiment, the conductive layer CL may include a metal material or a transparent conductive oxide. The conductive layer CL may include SUS, Invar alloy, ITO, IZO, or the like.

The hard masking layer HML may be a layer to mask the conductive layer CL and the polymer layer PL. In an embodiment, the hard masking layer HML may include a second polymer material. The hard masking layer HML may be formed by coating the second polymer material on the conductive layer CL. The first polymer material and the second polymer material may include different materials from each other. In an embodiment, the second polymer material may include silicon nitride, silicon oxide, amorphous silicon (a-si), or the like. However, the hard masking layer HML may include a metal material or a transparent conductive oxide. In this case, the hard masking layer HML may be formed by depositing the metal material or the transparent conductive oxide on the conductive layer CL using a sputtering process.

Figure 6:
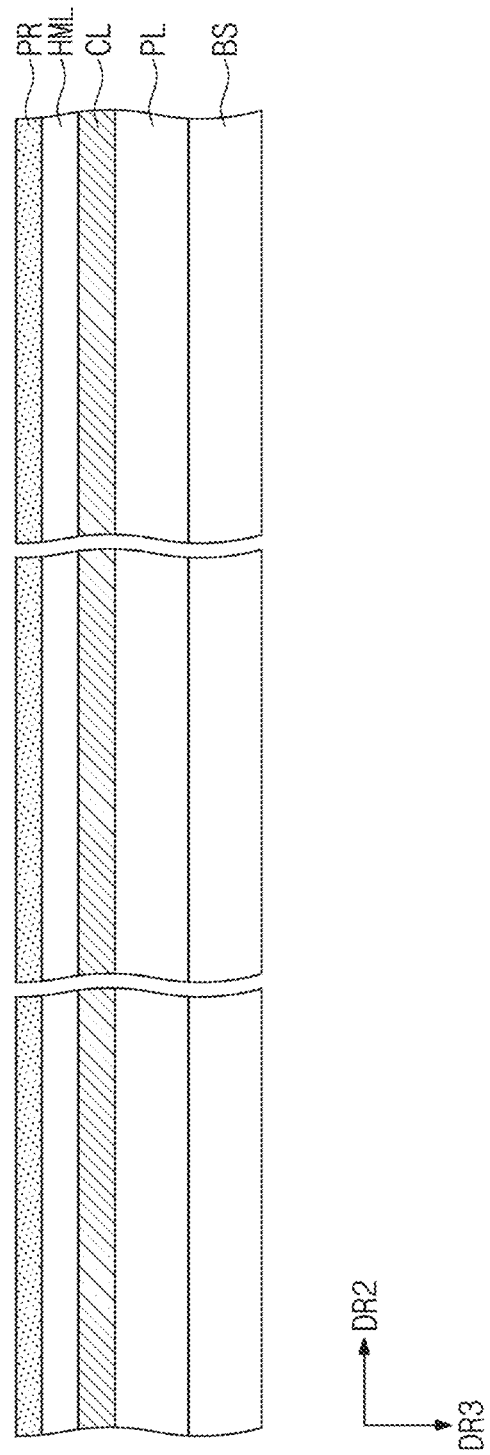
FIG. 6 is a view showing a process of coating a photoresist on a hard masking layer according to the invention.
Figure 7:
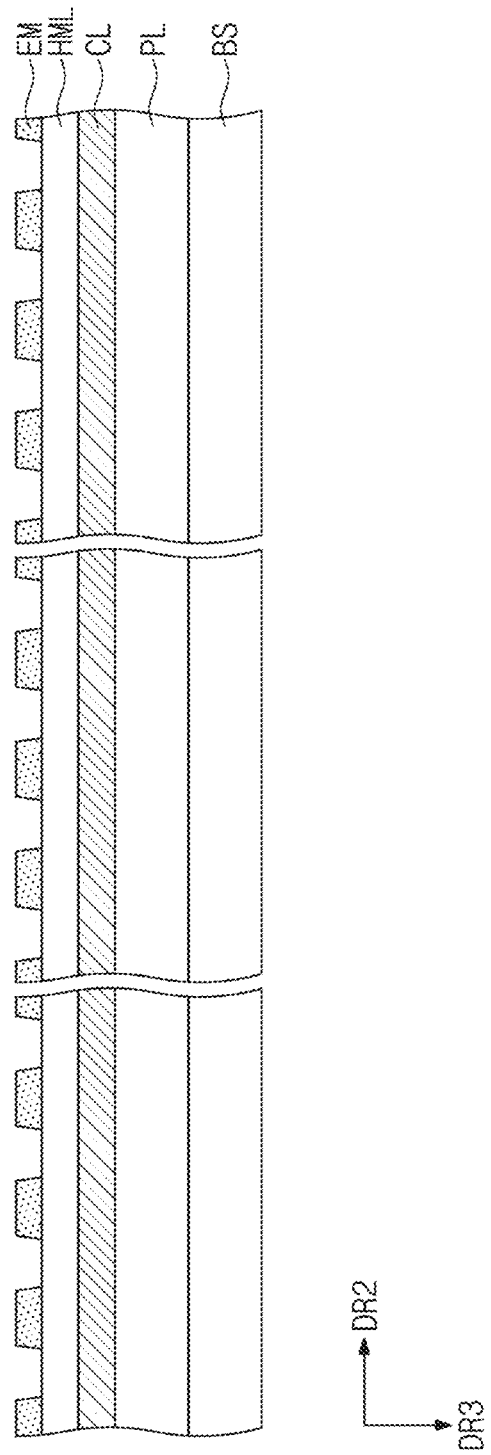
FIG. 7 is a view showing an embodiment of a process of patterning a photoresist to form an etch mask according to the invention.

FIG. 6 is a view showing an embodiment of a process of coating a photoresist PR on the hard masking layer according to the invention, and FIG. 7 is a view showing an embodiment of a process of patterning the photoresist PR to form an etch mask EM according to the invention.

Referring to FIGS. 6 and 7, the forming the cell mask CMK (refer to FIG. 2) and the mesh frame MSF (refer to FIG. 2) may further include coating the photoresist PR on the hard masking layer HML and patterning the photoresist PR to form the etch mask EM.

The photoresist PR may include a photosensitive material having characteristics changed in response to a light, and the photoresist PR may have different characteristics in a portion that receives the light and in a portion that does not receive the light. Accordingly, when an exposure process that irradiates the light onto the photoresist PR is performed after a light blocking layer that is partially opened is disposed on the photoresist PR, portions of the photoresist PR, which is not covered by the light blocking layer, may be exposed to the light. Then, the exposed portions may be developed, and thus, the etch mask EM may be formed.

In an embodiment, the etch mask EM may include an etch pattern to etch the hard masking layer HML described later.

Figure 8:
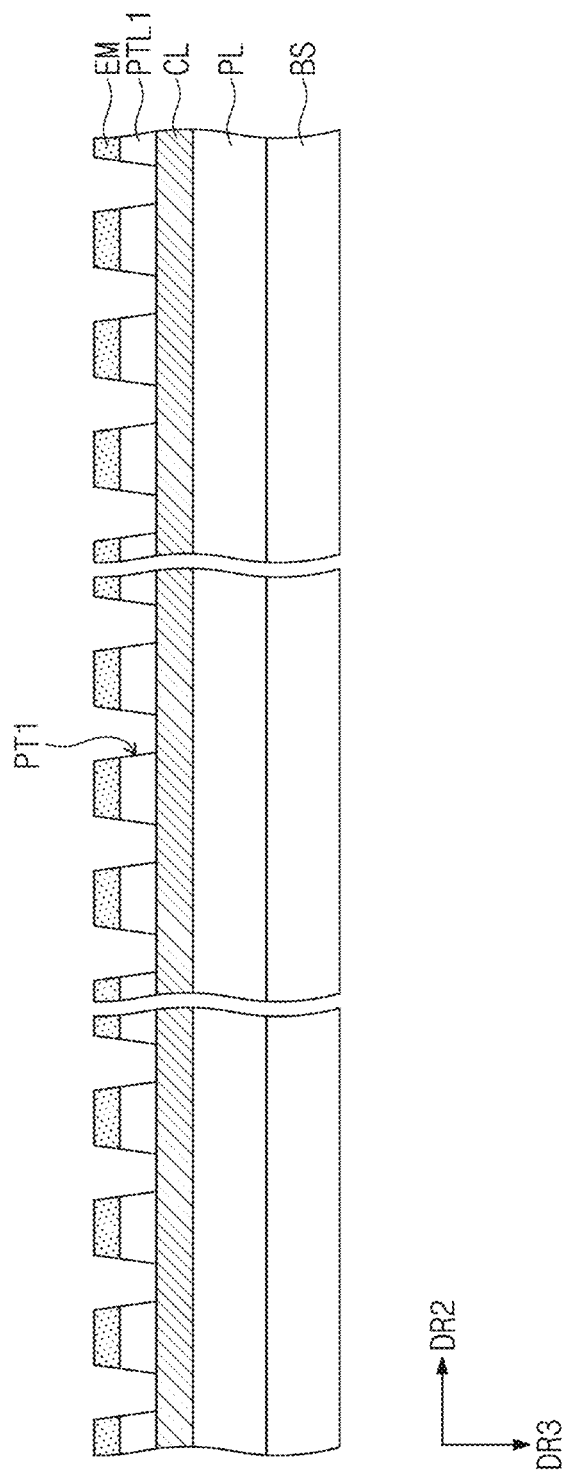
FIG. 8 is a view showing an embodiment of a process of forming a first pattern layer using an etch mask according to the invention.
Figure 9:
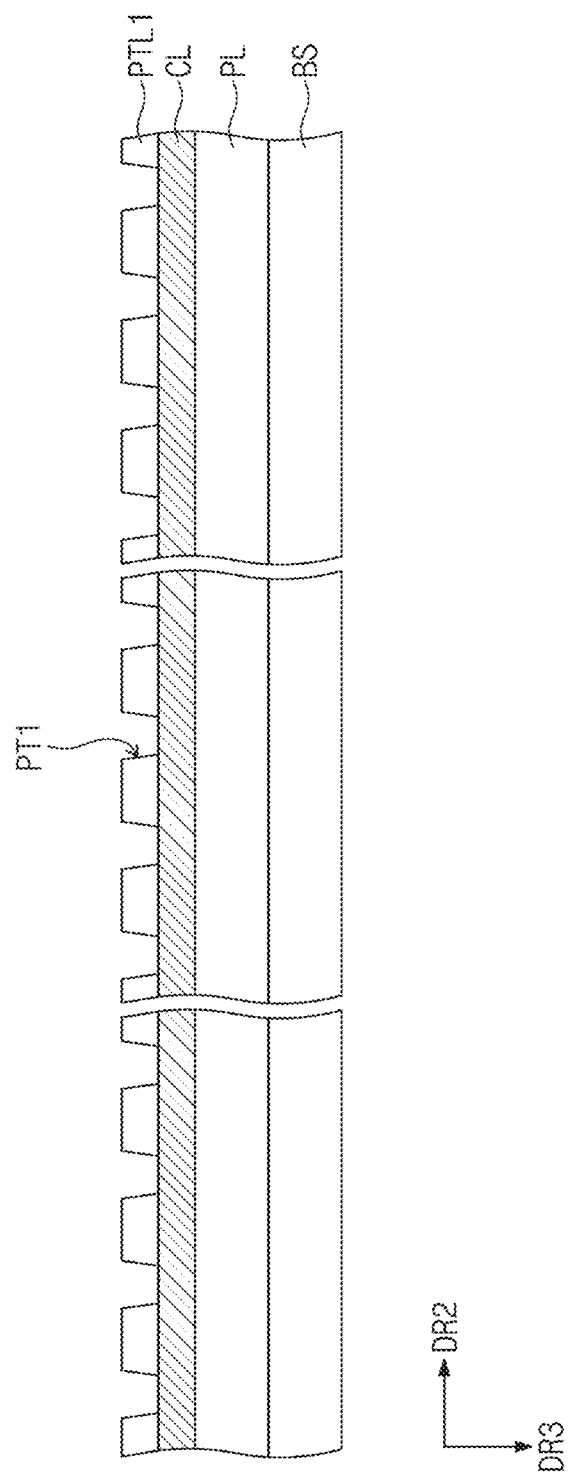
FIG. 9 is a view showing an embodiment of a process of removing an etch mask according to the invention.
Figure 10:
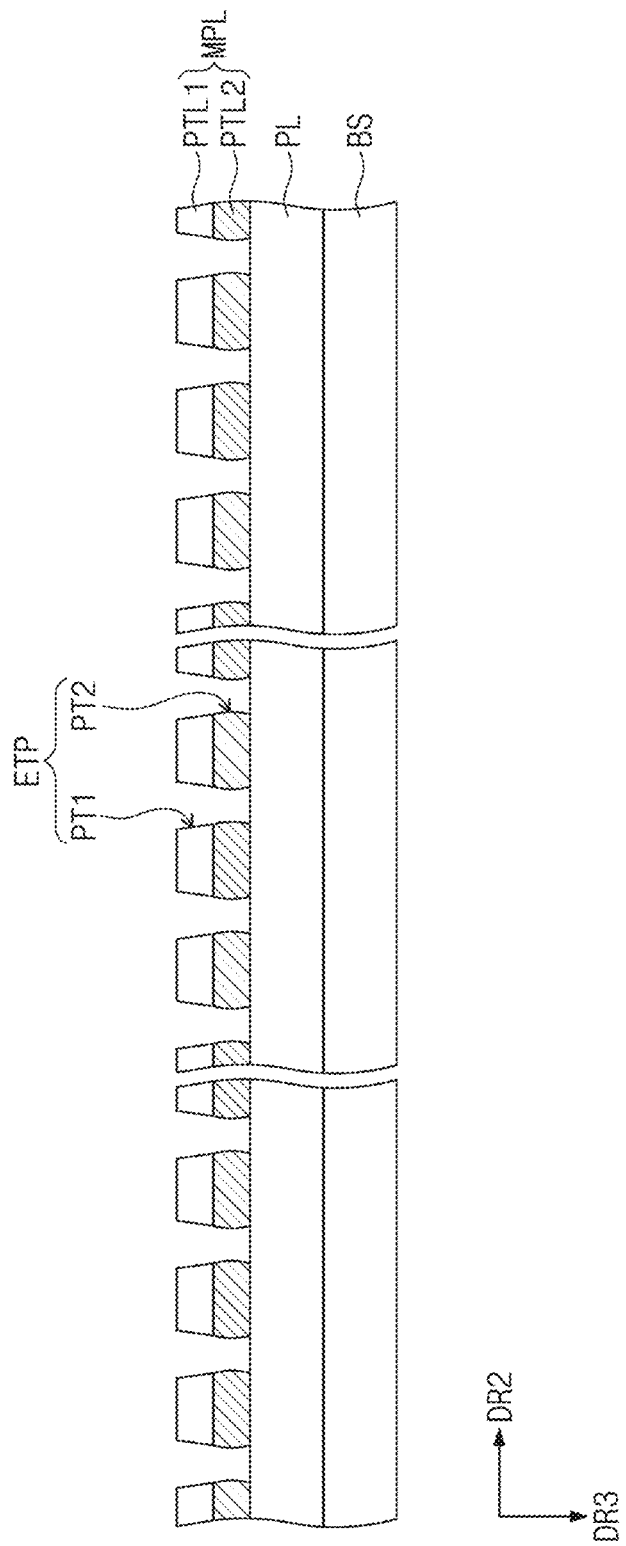
FIG. 10 is a view showing an embodiment of a process of forming a second pattern layer using a first pattern layer according to the invention.

FIG. 8 is a view showing an embodiment of a process of forming a first pattern layer PLT1 using the etch mask EM according to the invention, FIG. 9 is a view showing a process of removing the etch mask EM according to the invention, and FIG. 10 is a view showing a process of forming a second pattern layer PLT2 using the first pattern layer PLT1 according to the invention.

Referring to FIGS. 8 to 10, the forming the cell mask CMK (refer to FIG. 2) and the mesh frame MSF (refer to FIG. 2) may further include forming a mask pattern layer MPL including the etch pattern ETP.

The mask pattern layer MPL may include the first pattern layer PTL1 formed by etching the hard masking layer HML and the second pattern layer PTL2 formed by etching the conductive layer CL. The etch pattern ETP may include a plurality of first patterns PT1 included in the first pattern layer PTL1 and a plurality of second patterns PT2 provided in the second pattern layer PTL2.

The hard masking layer HML (refer to FIG. 7) may be etched using the etch mask EM to form the first pattern layer PTL1 including the first patterns PT1. In an embodiment, the hard masking layer HML may be etched using a second gas. The second gas may be a gas that selectively etches the hard masking layer HML among the hard masking layer HML and the conductive layer CL. In an embodiment, the second gas may be a fluorine-based gas. The hard masking layer HML may be etched using the second gas in a plasma state.

In an embodiment, in the case where the hard masking layer HML includes silicon nitride, silicon oxide, amorphous silicon (a-si), or the like and the conductive layer CL includes SUS, Invar alloy, ITO, IZO, or the like, the second gas may selectively etch only the hard masking layer HML among the hard masking layer HML and the conductive layer CL.

The etch mask EM may be removed after the first pattern layer PTL1 is formed. In an alternative embodiment, the etch mask EM may be removed after the second pattern layer PTL2 is formed using the first pattern layer PTL1. The conductive layer CL may be etched using the first pattern layer PTL1 to form the second pattern layer PTL2 including the second patterns PT2.

In an embodiment, the conductive layer may be etched using an etchant that may selectively etch only the conductive layer CL among the first pattern layer PTL1, the conductive layer CL, and the polymer layer PL. The conductive layer CL may be wet etched by the etchant to be isotropically etched. When the conductive layer CL is etched by the wet etching process, a side surface of each of the second patterns PT2 may have a curved shape. In addition, an undercut phenomenon in which the second patterns PT2 are etched more than the first patterns PT1 may occur.

When the first pattern layer PTL1 is used to etch the conductive layer CL, there is no need to coat a separate photoresist and to pattern the coated photoresist to etch the conductive layer CL. Accordingly, a time for the manufacturing process of the mask assembly MKA may be shortened, and the manufacturing process may be simplified.

FIG. 11 is a view showing an embodiment of a process of forming the cell mask CMK using the mask pattern layer MPL according to the invention.

Referring to FIG. 11, the forming the cell mask CMK and the mesh frame MSF (refer to FIG. 2) may further include forming the cell mask CMK including the masking patterns MPT using the mask pattern layer MPL.

In an embodiment, the polymer layer PL (refer to FIG. 10) may be etched using the mask pattern layer MPL to form the cell mask CMK. In an embodiment, the polymer layer PL may be etched using a first gas that selectively etches only the polymer layer PL among the first pattern layer PTL1 and the polymer layer PL. In an embodiment, the first gas may be an oxygen-based gas. The polymer layer PL may be etched using the first gas in a plasma state.

In an embodiment, in the case where the polymer layer PL includes polyimide and the first pattern layer PTL1 includes silicon nitride, silicon oxide, amorphous silicon (a-si), or the like, the first gas may selectively etch the polymer layer PL among the first pattern layer PTL1 and the polymer layer PL. In an embodiment, the first gas may selectively etch only the polymer layer PL among the polymer layer PL, the first pattern layer PTL1, and the second pattern layer PTL2.

In an embodiment, the polymer layer PL may have a thickness of several to tens of micrometers. Accordingly, when the polymer layer PL is dry etched using the first gas, the undercut phenomenon in which the masking patterns MPT are etched more than the second patterns PT2 may occur. In this case, the second patterns PT2 may have a width PTW greater than the width MPW of the masking patterns MPT.

Figure 12:
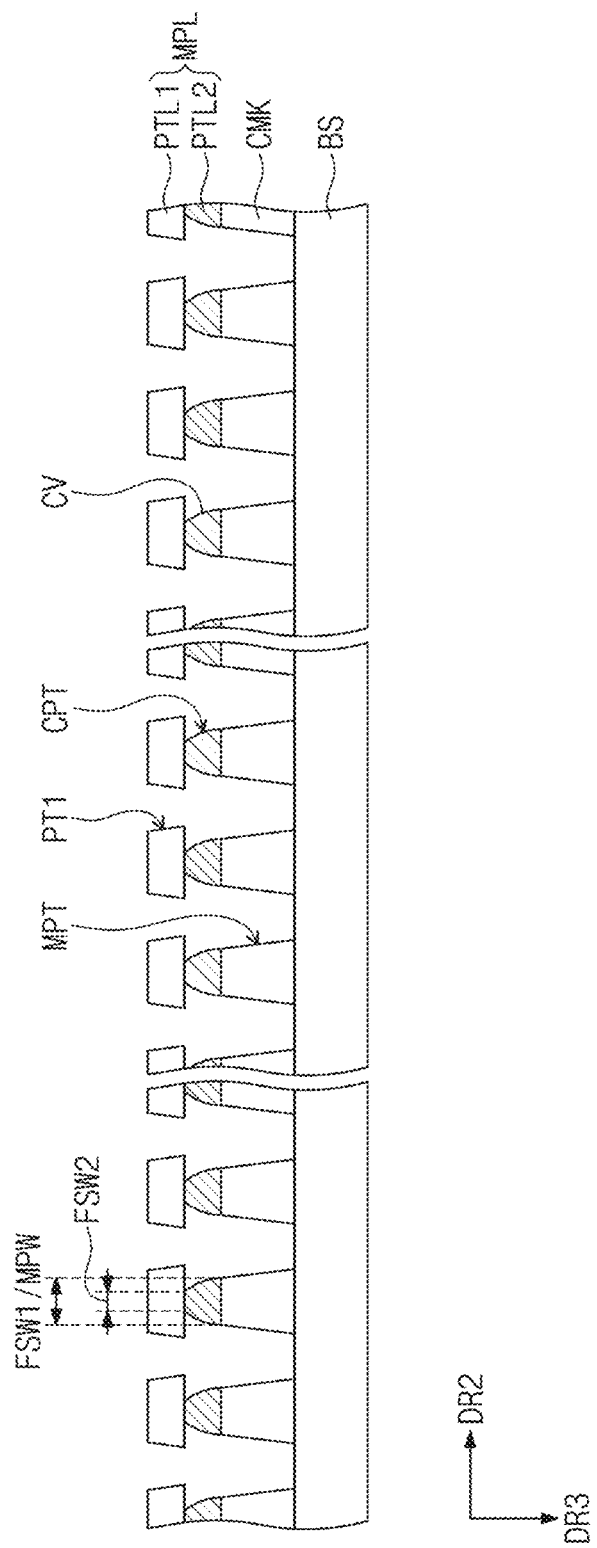
FIG. 12 is a view showing an embodiment of a process of etching second patterns to form conductive patterns according to the invention.

FIG. 12 is a view showing an embodiment of a process of etching the second patterns PT2 to form the conductive patterns CPT according to the invention.

Referring to FIG. 12, the forming the cell mask CMK and the mesh frame MSF (refer to FIG. 2) may further include etching the second patterns PT2 (refer to FIG. 11) after the forming the cell mask CMK to form the conductive patterns CPT.

The second patterns PT2 may be etched using an etchant that selectively etches only the second pattern layer PT2 among the first pattern layer PTL1, the second pattern layer PTL2, and the cell mask CMK. In an embodiment, the etchant used to etch the second patterns PT2 may include the same material as that of the etchant used to etch the conductive layer CL.

The second patterns PT2 may be wet-etched by the etchant to be isotropically etched. The conductive patterns CPT may include a side surface portion CV. In an embodiment, the side surface portion CV may have a curved surface shape. The masking patterns MPT included in the cell mask CMK may not be etched while the second patterns PT2 are etched. Accordingly, the conductive patterns CPT may have the width equal to or smaller than the width MPW of the masking patterns MPT. In an embodiment, the width FSW2 of the second surface FS2 (refer to FIG. 3) included in each of the conductive patterns CPT may be smaller than the width MPW of the masking patterns MPT, and the width FSW1 of the first surface FS1 (refer to FIG. 3) may be the same as the width MPW of the masking patterns MPT. However, in an embodiment, the width FSW1 of the first surface FS1 may be smaller than the width MPW of the masking patterns MPT.

Figure 13:
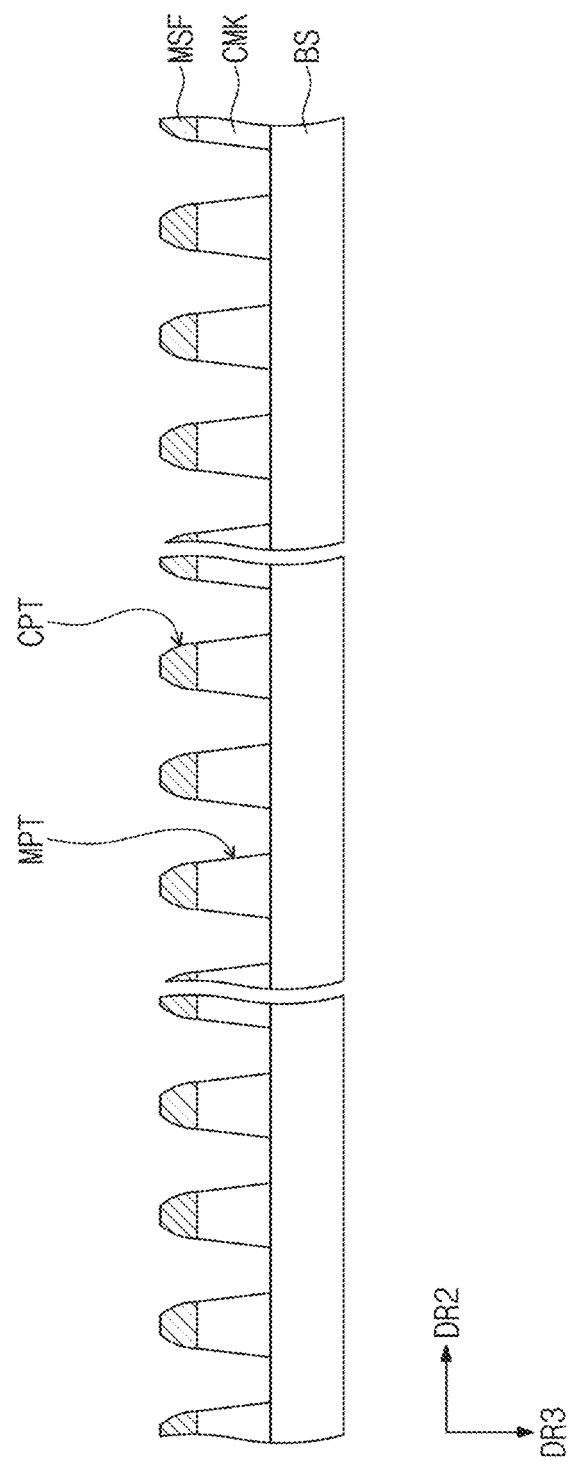
FIG. 13 is a view showing an embodiment of a process of partially removing a mask pattern layer to form a mesh frame according to the invention.

FIG. 13 is a view showing an embodiment of a process of partially removing the mask pattern layer MPL to form the mesh frame MSF according to the invention.

Referring to FIG. 13, the forming the cell mask CMK and the mesh frame MSF may further include partially removing the mask pattern layer MPL (refer to FIG. 12) to form the mesh frame MSF.

The mask pattern layer MPL may be partially removed using the second gas that selectively etches the first pattern layer PTL1 among the first pattern layer PTL1 (refer to FIG. 12) and the second pattern layer PTL2. The mesh frame MSF may be formed by removing the first pattern layer PTL1 from the mask pattern layer MPL. The second gas may selectively etch only the first pattern layer PTL1 among the cell mask CMK, the first pattern layer PTL1, and the second pattern layer PTL2. In an embodiment, the second gas used to remove the first pattern layer PTL1 may be substantially the same as the second gas used to etch the hard masking layer HML.

Figure 14:
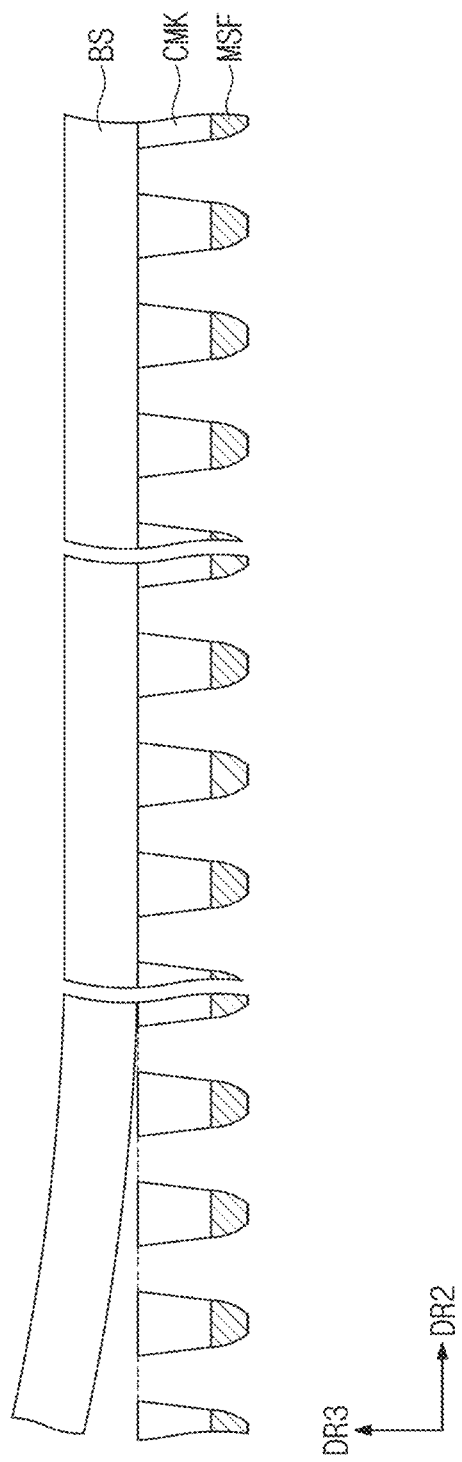
FIG. 14 is a view showing an embodiment of a process of separating a base substrate from a cell mask according to the invention.

FIG. 14 is a view showing an embodiment of a process of separating the base substrate BS from the cell mask CMK according to the invention.

Referring to FIG. 14, the forming the cell mask CMK and the mesh frame MSF may further include the separating the base substrate BS from the cell mask CMK.

The mask assembly MKA (refer to FIG. 3) may be manufactured by disposing the cell mask CMK and the mesh frame MSF, which are separated from the base substrate BS, on the mask frame MF (refer to FIG. 3). In an embodiment, the cell mask CMK and the mesh frame MSF may be disposed on the mask frame MF in a state in which a tensile force is applied to the cell mask CMK and the mesh frame MSF.

Although the embodiments of the invention have been described, it is understood that the invention should not be limited to these embodiments but various changes and modifications may be made by one ordinary skilled in the art within the spirit and scope of the invention.

Therefore, the disclosed subject matter should not be limited to any single embodiment described herein, and the scope of the invention shall be determined according to the attached claims.

What is claimed is:

1. A method of manufacturing a mask assembly, comprising:
    forming a cell mask comprising a plurality of masking patterns and a mesh frame comprising a plurality of conductive patterns disposed to correspond to the plurality of masking patterns; and
    disposing the cell mask and the mesh frame on a mask frame, the forming the cell mask and the mesh frame comprising:
        forming a polymer layer on a base substrate;
        forming a conductive layer directly on the polymer layer;
        forming a hard masking layer directly on the conductive layer, the hard masking layer comprising a first polymer material;
        etching the hard masking layer and the conductive layer and forming a mask pattern layer comprising etch patterns; and
        etching the polymer layer using the mask pattern layer and forming the cell mask and the mesh frame.

2. The method of claim 1, wherein the polymer layer comprises a second polymer material, and the second polymer material is different from the first polymer material.

3. The method of claim 1, wherein the forming the cell mask and the mesh frame further comprises:
    partially removing the mask pattern layer for the forming the mesh frame; and
    separating the base substrate from the cell mask.

4. The method of claim 3, wherein the mask pattern layer comprises:
    a first pattern layer formed by etching the hard masking layer; and
    a second pattern layer formed by etching the conductive layer.

5. The method of claim 4, wherein the etching the polymer layer is performed using a gas which selectively etches the polymer layer among the first pattern layer and the polymer layer.

6. The method of claim 4, wherein the partially removing the mask pattern layer comprises removing the first pattern layer from the mask pattern layer using a gas which selectively etches the first pattern layer among the first and second pattern layers.

7. The method of claim 6, wherein the gas selectively etches the first pattern layer among the cell mask, the first pattern layer, and the second pattern layer.

8. The method of claim 4, wherein the forming the cell mask and the mesh frame further comprises:
coating a photoresist on the hard masking layer; and
patterning the photoresist and forming an etch mask.

9. The method of claim 8, wherein the etch patterns comprise:
a plurality of first patterns provided on the first pattern layer; and
a plurality of second patterns provided on the second pattern layer.

10. The method of claim 9, wherein the forming the mask pattern layer comprises:
etching the hard masking layer using the etch mask and forming the first pattern layer comprising the plurality of first patterns; and
etching the conductive layer using the first pattern layer and forming the second pattern layer comprising the plurality of second patterns.

11. The method of claim 10, wherein the forming the cell mask and the mesh frame further comprises removing the etch mask after the forming the first pattern layer.

12. The method of claim 10, wherein the etching the hard masking layer comprises etching the hard masking layer using a gas.

13. The method of claim 12, wherein the gas selectively etches the hard masking layer among the hard masking layer and the conductive layer.

14. The method of claim 10, wherein the etching the conductive layer is performed using an etchant which selectively etches the conductive layer among the first pattern layer, the conductive layer, and the polymer layer.

15. The method of claim 10, wherein the forming the cell mask and the mesh frame further comprises etching the plurality of second patterns after the forming the cell mask and forming the conductive patterns.

16. The method of claim 15, wherein the etching the plurality of second patterns comprises etching the plurality of second patterns included in the second pattern layer using an etchant which selectively etches the second pattern layer among the first pattern layer, the second pattern layer, and the cell mask.

* * * * *